(12) United States Patent
Shimamura et al.

(10) Patent No.: US 9,101,044 B2
(45) Date of Patent: Aug. 4, 2015

(54) CIRCUIT MODULE AND METHOD OF PRODUCING THE SAME

(71) Applicant: Taiyo Yuden Co., Ltd., Tokyo (JP)

(72) Inventors: Masaya Shimamura, Tokyo (JP); Kenzo Kitazaki, Tokyo (JP); Yutaka Nagai, Tokyo (JP); Hiroshi Nakamura, Tokyo (JP); Tetsuo Saji, Tokyo (JP); Eiji Mugiya, Tokyo (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 0 days.

(21) Appl. No.: 14/086,407

(22) Filed: Nov. 21, 2013

(65) Prior Publication Data

US 2015/0043170 A1    Feb. 12, 2015

(30) Foreign Application Priority Data

Aug. 9, 2013    (JP) .................................. 2013-167115

(51) Int. Cl.
*H05K 9/00* (2006.01)
*H05K 1/18* (2006.01)
*H05K 3/30* (2006.01)

(52) U.S. Cl.
CPC ................. *H05K 9/00* (2013.01); *H05K 1/186* (2013.01); *H05K 3/301* (2013.01)

(58) Field of Classification Search
CPC .......... H05K 1/186; H05K 3/301; H05K 9/00
USPC .................... 361/728, 760, 796, 800
See application file for complete search history.

(56) References Cited

U.S. PATENT DOCUMENTS 5,566,055 A * 10/1996 Salvi, Jr. ..................... 361/816
5,639,989 A *  6/1997 Higgins, III ................. 174/386

(Continued)

FOREIGN PATENT DOCUMENTS

| JP | H05-067039 U | 9/1993 |
| JP | 2001-135899 A | 5/2001 |

(Continued)

OTHER PUBLICATIONS

Office Action issued in corresponding Japanese Application No. 2013-169160 dated Nov. 26, 2013 and English translation of the same (7 pages).

(Continued)

*Primary Examiner* — David M Sinclair
*Assistant Examiner* — Theron Milliser
(74) *Attorney, Agent, or Firm* — Fitch Even Tabin & Flannery LLP

(57) ABSTRACT

A circuit module includes a substrate, a mount component, a sealing body, a trench and a shield. The substrate has a mount surface. The mount component is mounted on the mount surface. The sealing body has a main surface and an outer peripheral surface, the sealing body sealing the mount component, the main surface sandwiching the mount component between the main surface and the mount surface, the outer peripheral surface covering the mount component on the mount surface. The trench has a groove-like shape, the trench being recessed from the main surface of the sealing body to the mount surface, the trench being formed to leave a space between the trench and the outer peripheral surface. The shield covers the main surface and the outer peripheral surface of the sealing body, the shield being filled in the trench.

11 Claims, 10 Drawing Sheets

(56) References Cited

U.S. PATENT DOCUMENTS

| | | | |
|---|---|---|---|
| 6,492,194 B1* | 12/2002 | Bureau et al. | 438/106 |
| 6,649,446 B1* | 11/2003 | Goetz et al. | 438/110 |
| 6,903,932 B2* | 6/2005 | Wennemuth et al. | 361/714 |
| 6,992,400 B2* | 1/2006 | Tikka et al. | 257/787 |
| 6,998,532 B2* | 2/2006 | Kawamoto et al. | 174/521 |
| 7,125,744 B2* | 10/2006 | Takehara et al. | 438/106 |
| 7,129,422 B2* | 10/2006 | Arnold | 174/377 |
| 7,259,041 B2* | 8/2007 | Stelzl et al. | 438/106 |
| 7,388,281 B2* | 6/2008 | Krueger et al. | 257/678 |
| 7,443,693 B2* | 10/2008 | Arnold et al. | 361/800 |
| 7,445,968 B2* | 11/2008 | Harrison et al. | 438/124 |
| 7,468,548 B2* | 12/2008 | Wu et al. | 257/675 |
| 7,643,311 B2* | 1/2010 | Coffy | 361/818 |
| 7,701,040 B2* | 4/2010 | Huang et al. | 257/659 |
| 7,820,468 B2* | 10/2010 | Lee et al. | 438/51 |
| 8,008,753 B1* | 8/2011 | Bolognia | 257/659 |
| 8,062,930 B1* | 11/2011 | Shah et al. | 438/110 |
| 8,093,691 B1* | 1/2012 | Fuentes et al. | 257/660 |
| 8,115,117 B2 | 2/2012 | Kapusta et al. | 174/386 |
| 8,169,041 B2 | 5/2012 | Pahl et al. | 257/416 |
| 8,178,956 B2* | 5/2012 | Do et al. | 257/676 |
| 8,220,145 B2* | 7/2012 | Hiner et al. | 29/841 |
| 8,247,889 B2* | 8/2012 | Liao et al. | 257/659 |
| 8,276,268 B2* | 10/2012 | Kapusta et al. | 29/832 |
| 8,432,007 B2* | 4/2013 | Leidl et al. | 257/416 |
| 8,653,633 B2* | 2/2014 | Liao et al. | 257/659 |
| 8,654,537 B2* | 2/2014 | Fisher et al. | 361/750 |
| 2006/0267159 A1* | 11/2006 | Yamamoto et al. | 257/659 |
| 2006/0274517 A1* | 12/2006 | Coffy | 361/816 |
| 2008/0049386 A1* | 2/2008 | Pornin et al. | 361/679 |
| 2009/0079041 A1* | 3/2009 | Huang et al. | 257/660 |
| 2009/0152688 A1* | 6/2009 | Do et al. | 257/659 |
| 2011/0006408 A1* | 1/2011 | Liao | 257/660 |
| 2011/0285215 A1 | 11/2011 | Hatase | |
| 2012/0000699 A1 | 1/2012 | Inoue | |
| 2012/0140423 A1* | 6/2012 | Fisher et al. | 361/748 |
| 2012/0235259 A1* | 9/2012 | Fang et al. | 257/428 |
| 2013/0002042 A1 | 1/2013 | Hatase | |

FOREIGN PATENT DOCUMENTS

| | | |
|---|---|---|
| JP | 2003-174263 A | 6/2003 |
| JP | 2010-225620 A | 10/2010 |
| JP | 2012-019901 A | 2/2012 |
| JP | 2012-243836 A | 12/2012 |
| WO | 2010/089921 A1 | 8/2010 |

OTHER PUBLICATIONS

Office Action issued in corresponding Japanese Application No. 2013-169160 dated Mar. 4, 2014 and English translation of the same (6 pages).

* cited by examiner

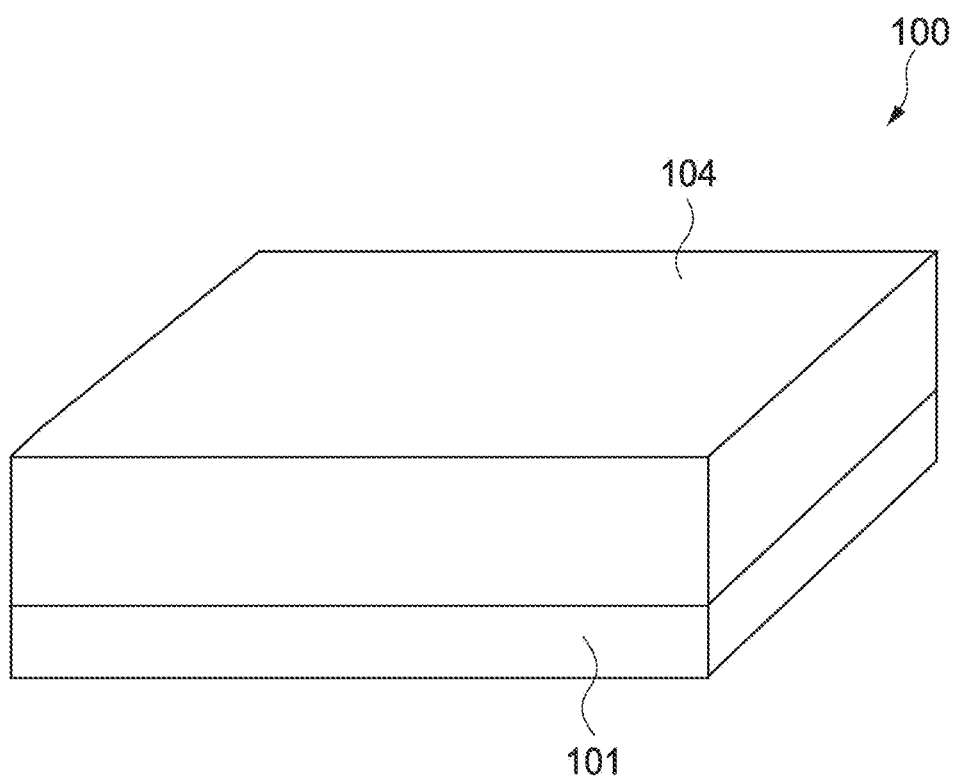
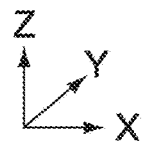
FIG.1

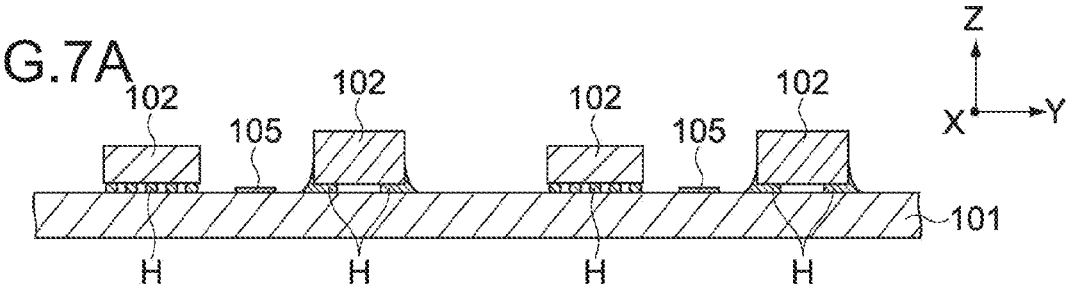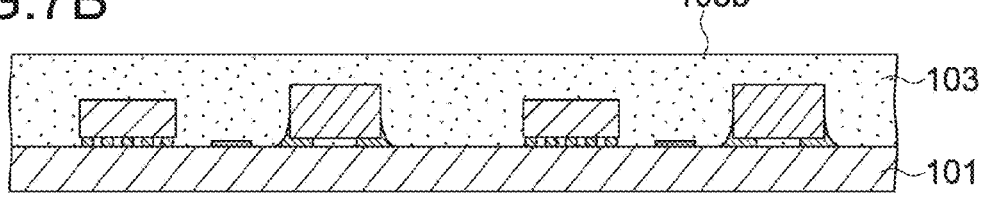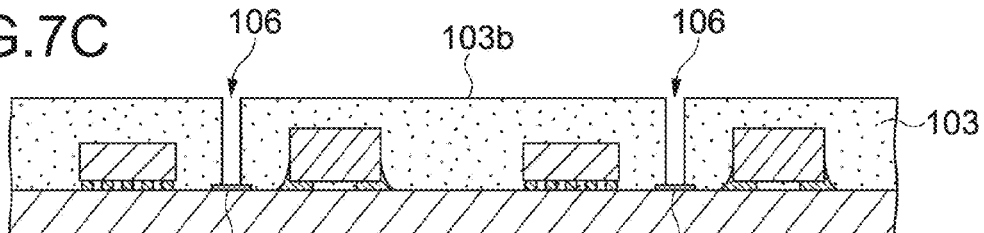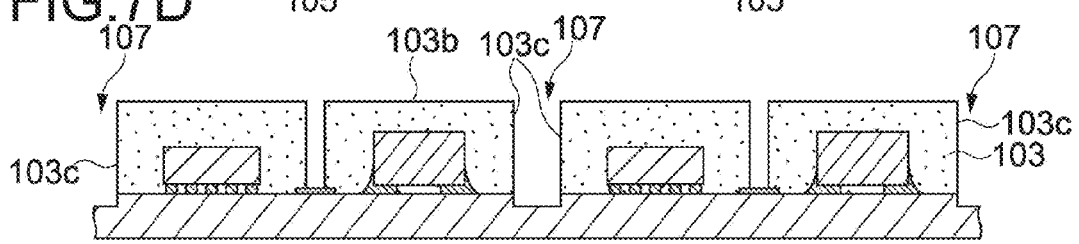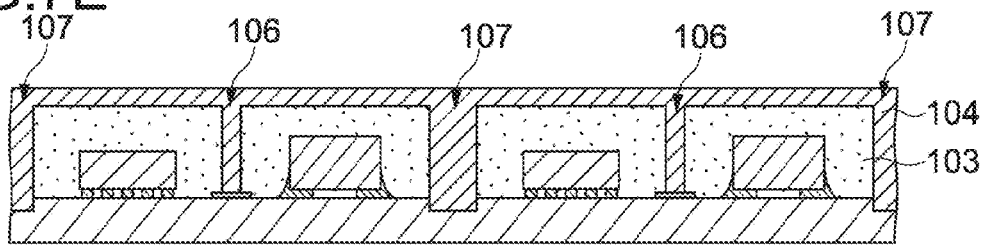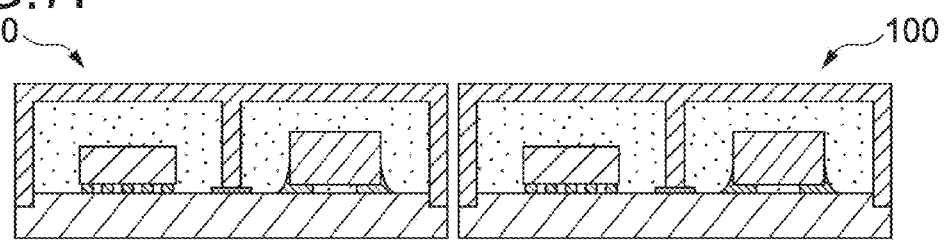

CIRCUIT MODULE AND METHOD OF PRODUCING THE SAME

CROSS-REFERENCE TO RELATED APPLICATION

This application claims priority under 35 U.S.C. §119 to Japanese Patent Application No. JP 2013-167115 filed on Aug. 9, 2013, the entire content of which is hereby incorporated herein by reference in its entirety.

FIELD

The present disclosure relates to a circuit module and a method of producing the circuit module.

BACKGROUND

A circuit module in which a sealing body including synthetic resin or the like seals around a mount component mounted on a circuit substrate has been used. Here, there exists a circuit module in which a surface of the sealing body is covered by a conductor and the conductor is used as a shield against an electromagnetic wave in the case where the mount component includes a wireless communication element, for example. The shield blocks electromagnetic interference from the mount component to the outside of the circuit module or electromagnetic interference from the outside of the circuit module to the mount component.

Furthermore, a circuit module in which a shield is disposed to separate a plurality of mount components with each other in order to block electromagnetic interference between the mount components, in the case where the mount components are mounted on the circuit substrate, has also been developed. Because the mount component is covered by the sealing body as described above, it is possible to form a trench (groove) by partially removing the sealing body and to form a conductor in the trench to use the conductor as a shield between the mount components.

Japanese Patent Application Laid-open No. 2010-225620 discloses a circuit module having a configuration in which a mold resin layer covering electronic components is covered by a conductive resin layer. In the circuit module, a slit separating the electronic components is formed on the mold resin layer and the conductive resin layer is filled in the slit. Accordingly, the conductive resin layer functions as a shield between the electronic components.

SUMMARY

In the circuit module described in Japanese Patent Application Laid-open No. 2010-225620, because the slit is formed across the full width of the mold resin layer, warpage is likely to occur around the slit with the expansion or contraction of the conductive resin layer due to a change in an ambient environment such as temperature.

In view of the circumstances as described above, it is desirable to provide a circuit module that is unlikely to be deformed and a method of producing the circuit module.

According to an embodiment of the present disclosure, there is provided a circuit module including a substrate, a mount component, a sealing body, a trench, and a shield.

The substrate has a mount surface.

The mount component is mounted on the mount surface.

The sealing body has a main surface and an outer peripheral surface, the sealing body sealing the mount component, the main surface sandwiching the mount component between the main surface and the mount surface, the outer peripheral surface covering the mount component on the mount surface.

The trench has a groove-like shape, the trench being recessed from the main surface of the sealing body to the mount surface, the trench being formed to leave a space between the trench and the outer peripheral surface.

The shield covers the main surface and the outer peripheral surface of the sealing body, the shield being filled in the trench.

Moreover, according to an embodiment of the present disclosure, there is provided a method of producing a circuit module including mounting a mount component on a mount surface of a substrate.

A sealing body is provided on the mount surface, the sealing body having a main surface, the sealing body sealing the mount component, the main surface sandwiching the mount component between the main surface and the mount surface.

An outer peripheral surface is formed on the sealing body provided on the mount surface by cutting the sealing body along an outline of the sealing body, the outer peripheral surface covering the mount component on the mount surface.

A trench is formed on the sealing body provided on the mount surface to leave a space between the trench and the outline of the sealing body, the trench having a groove-like shape, the trench being recessed from the main surface to the mount surface.

A shield is filled in the trench after the outer peripheral surface and the trench are formed on the sealing body, the shield covering the main surface and the outer peripheral surface of the sealing body.

These and other objects, features and advantages of the present disclosure will become more apparent in light of the following detailed description of best mode embodiments thereof, as illustrated in the accompanying drawings.

BRIEF DESCRIPTION OF THE DRAWINGS

FIG. 1 is a perspective view of a circuit module according to an embodiment of the present disclosure;

FIGS. 7A-7F are each a cross-sectional view showing a process of producing the circuit module;

DETAILED DESCRIPTION OF THE EMBODIMENTS

Figure 2:
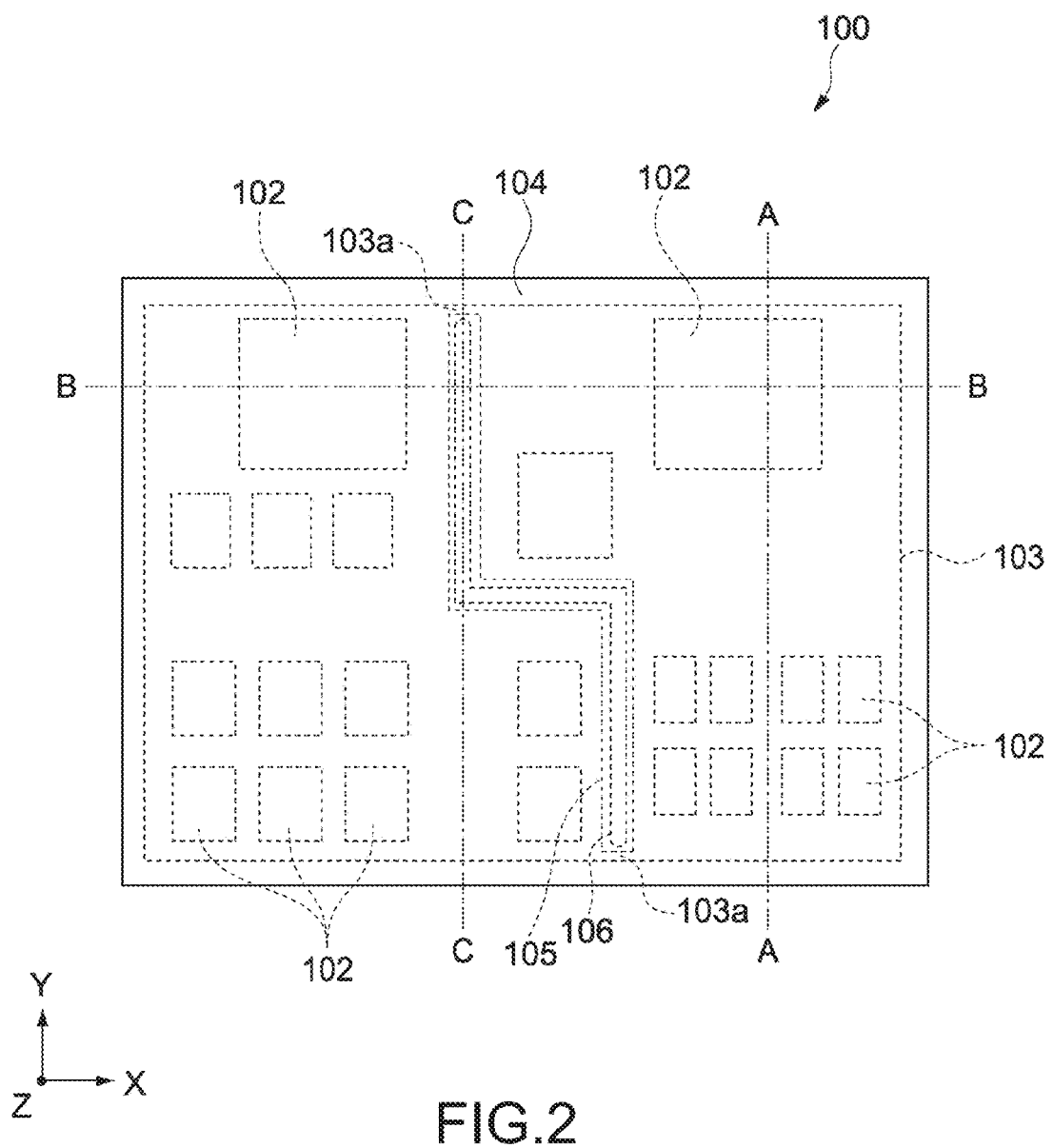
FIG. 2 is a plan view of the circuit module.

A circuit module according to an embodiment of the present disclosure includes a substrate, a mount component, a sealing body, a trench, and a shield.

The substrate has a mount surface.

The mount component is mounted on the mount surface.

The sealing body has a main surface and an outer peripheral surface, the sealing body sealing the mount component, the main surface sandwiching the mount component between the main surface and the mount surface, the outer peripheral surface covering the mount component on the mount surface.

The trench has a groove-like shape, the trench being recessed from the main surface of the sealing body to the mount surface, the trench being formed to leave a space between the trench and the outer peripheral surface; and The shield covers the main surface and the outer peripheral surface of the sealing body, the shield being filled in the trench.

With this configuration, the trench does not divide the sealing body, resulting in the integrated sealing body. Because the sealing body maintains the shape integrally, it is possible to suppress the reduction in strength due to the forming of the trench. Therefore, it is possible to prevent the circuit module from being deformed due to the expansion or contraction of the sealing body or shield.

The circuit module may further have a surface layer conductor provided on the mount surface along the trench.

Moreover, the trench may extend from the main surface to the surface layer conductor.

Furthermore, the shield may be connected to the surface layer conductor.

With this configuration, the potential of the shield is equal to that of the surface layer conductor. Specifically, in the case where the surface layer conductor has a ground potential, the shield also has a ground potential.

The mount component may include a plurality of mount components.

Moreover, the trench may separate the plurality of mount components from each other.

With this configuration, the shield filled in the trench is disposed between the plurality of mount components. Therefore, the shield blocks an electromagnetic wave between the plurality of mount components.

The trench may have a plurality of end portions shaped like a circular arc on the main surface.

With this configuration, the shielding body is unlikely to be deformed even if the shield applies pressure to the sealing body.

The trench may have a plurality of end portions, the plurality of end portions of the trench being formed to be shallower than other portions of the trench.

With this configuration, it is possible to prevent the mount surface from being damaged during the laser processing of the trench.

Moreover, a method of producing a circuit module according to an embodiment of the present disclosure includes mounting a mount component on a mount surface of a substrate.

A sealing body is provided on the mount surface, the sealing body having a main surface, the sealing body sealing the mount component, the main surface sandwiching the mount component between the main surface and the mount surface.

An outer peripheral surface is formed on the sealing body provided on the mount surface by cutting the sealing body along an outline of the sealing body, the outer peripheral surface covering the mount component on the mount surface.

A trench is formed on the sealing body provided on the mount surface to leave a space between the trench and the outline of the sealing body, the trench having a groove-like shape, the trench being recessed from the main surface to the mount surface.

A shield is filled in the trench after the outer peripheral surface and the trench are formed on the sealing body, the shield covering the main surface and the outer peripheral surface of the sealing body.

With this configuration, a space is left between the trench and the outer peripheral surface formed on the sealing body. Accordingly, for example, in the case where the outer peripheral surface is formed after the trench is formed, it is possible to prevent an angle portion of the trench from cracking during the forming of the outer peripheral surface.

The surface layer conductor may be formed on the mount surface along the trench before the sealing body is provided on the mount surface.

With this configuration, for example, because a laser is blocked by the surface layer conductor when the trench is formed by laser processing, it is possible to form the trench to have a constant depth.

The trench may be formed by laser processing.

Moreover, output of a laser when the trench is formed may be set to be lower at an end portion of the trench than at other portions of the trench.

With this configuration, it is possible to prevent the mount surface from being damaged during the processing of the trench.

A circuit module according to an embodiment of the present disclosure will be described.

[Configuration of Circuit Module 100]

Figure 3:
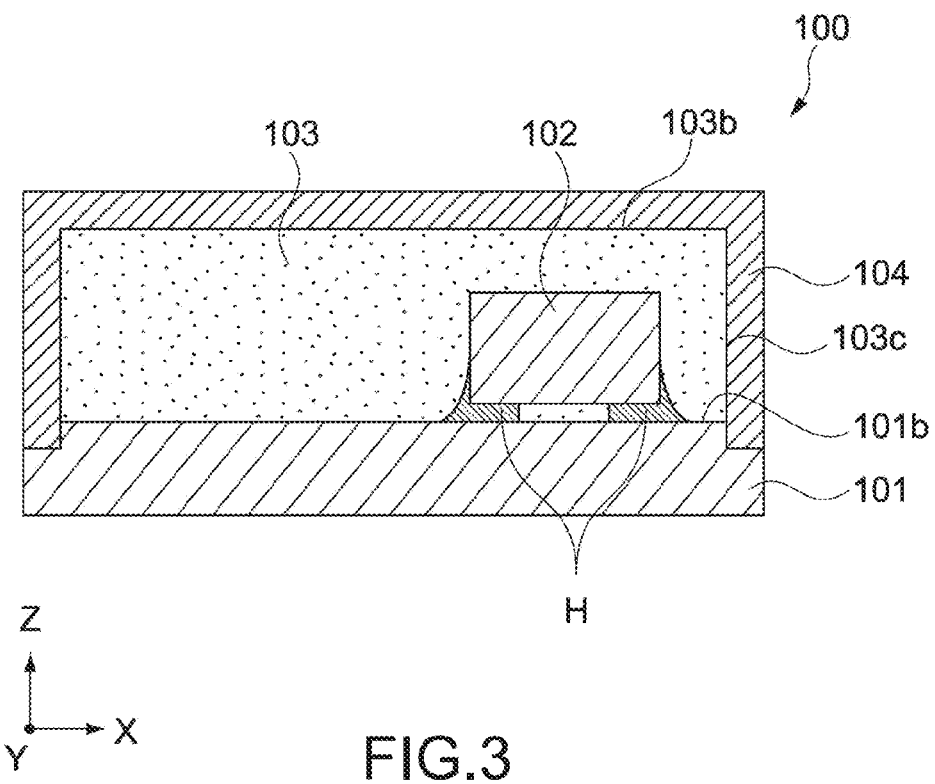
FIG. 3 is a cross-sectional view of the circuit module (taken along the line A-A in FIG. 2)
Figure 4:
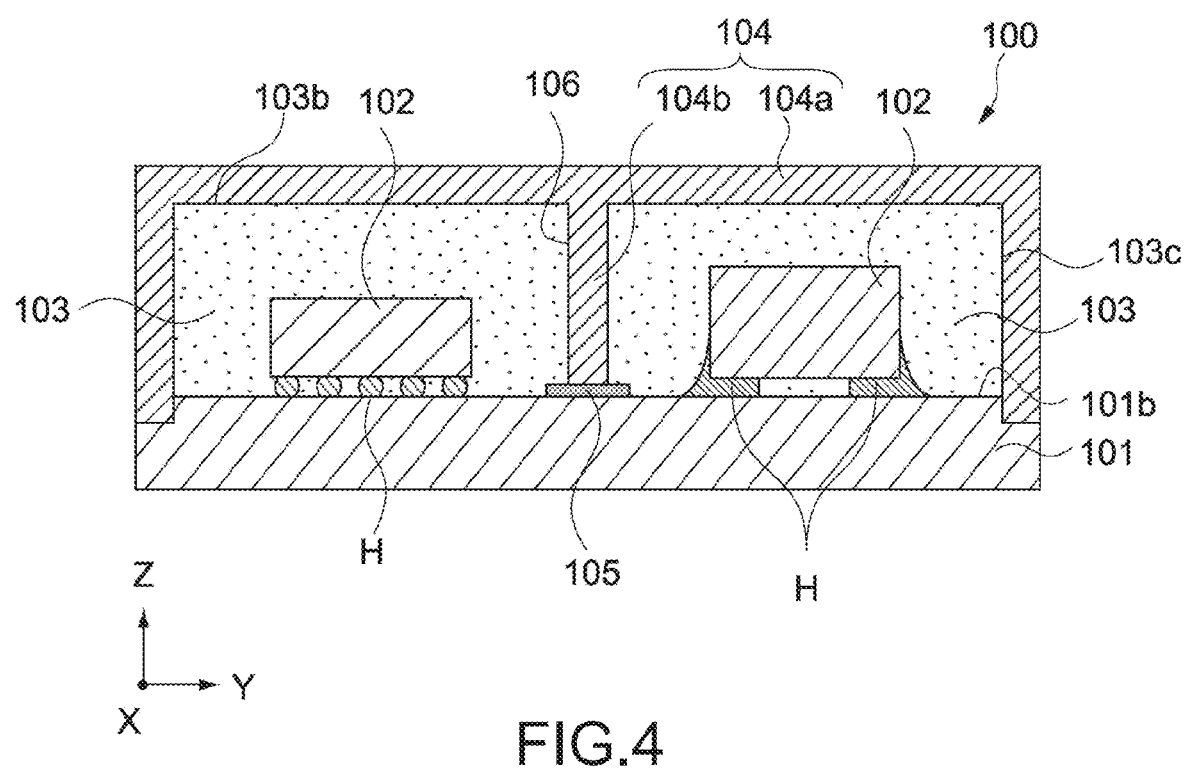
FIG. 4 is a cross-sectional view of the circuit module (taken along the line B-B in FIG. 2)
Figure 5:
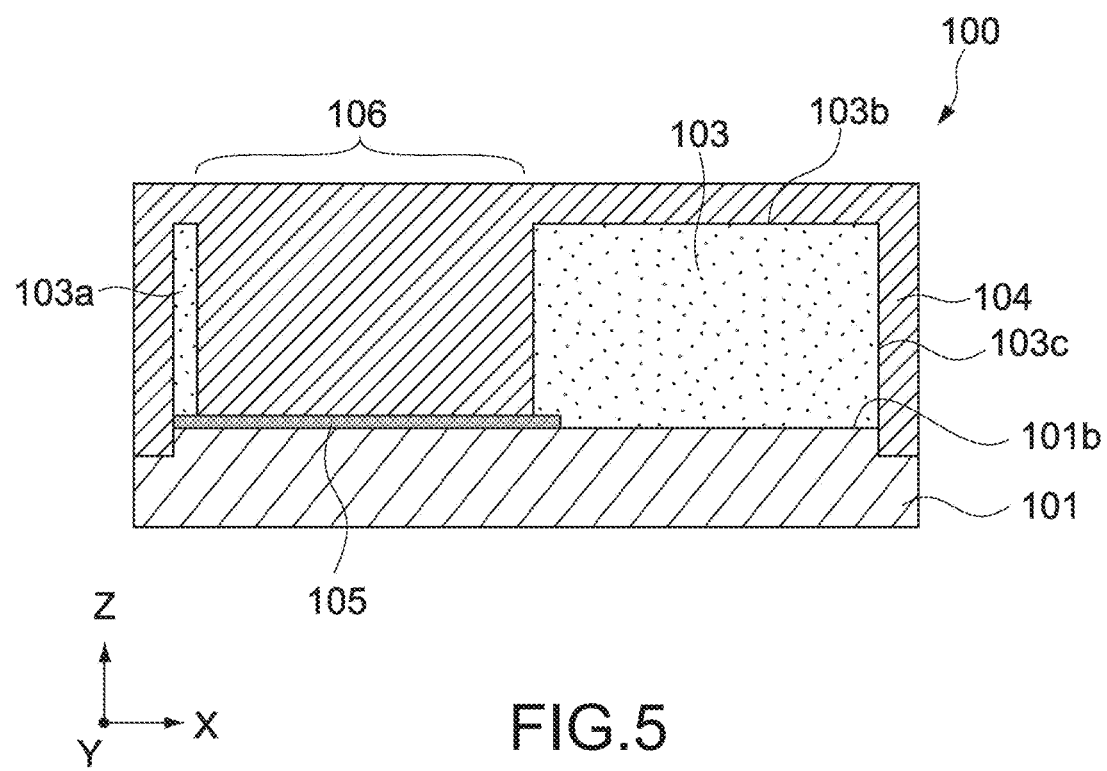
FIG. 5 is a cross-sectional view of the circuit module (taken along the line C-C in FIG. 2.)

FIG. 1 is a perspective view of a circuit module 100 according to this embodiment, and FIG. 2 is a plan view of the circuit module 100. Moreover, FIGS. 3, 4, and 5 are each a cross-sectional view of the circuit module 100. FIG. 3 is a cross-sectional view taken along the line A-A in FIG. 2, FIG. 4 is a cross-sectional view taken along the line B-B in FIG. 2, and FIG. 5 is a cross-sectional view taken along the line C-C in FIG. 2. It should be noted that in each figure, an X direction, Y direction, and Z direction represent directions orthogonal to each other.

As shown in FIGS. 1 to 5, the circuit module 100 includes a circuit substrate 101, a mount component 102, a sealing body 103, and a shield 104. The size or shape of the circuit module 100 is not particularly limited. For example, the circuit module 100 has a rectangular parallelepiped shape, a size of several tens mm square, and a thickness of several mm.

The circuit substrate 101 includes a substrate on which the mount component 102 or the like is mounted. The circuit substrate 101 includes a multilayer substrate in which layers including an insulating material such as a glass epoxy material and an insulating ceramic material are laminated, and an interlayer wiring is formed in the layers. Hereinafter, a surface of the circuit substrate 101 (upper surface in Z-axis direction) on which the mount component 102 is mounted is referred to as a mount surface 101b.

As shown in FIGS. 2, 4, and 5, a surface layer conductor 105 is formed on the mount surface 101b. The surface layer conductor 105 extends in the Y-axis direction on the mount surface 101b, and is offset in the X-axis direction at the central portion of the Y-axis direction (extension direction). The surface layer conductor 105 is formed of a conductive material such as copper. The surface layer conductor 105 is formed along the area between the plurality of mount components 102 so as not to connect to each mount component 102 on the mount surface 101b.

The surface layer conductor 105 is connected to the interlayer wiring formed in the circuit substrate 101, and is electrically connected to the mount component 102 via the interlayer wiring, for example. Specifically, the surface layer conductor 105 may be electrically connected to a ground terminal of the circuit module 100. In this case, the surface layer conductor 105 has the same potential as the ground potential of the circuit module 100.

The mount component 102 is mounted on the mount surface 101b of the circuit substrate 101, and includes an integrated circuit (IC), a capacitor, an inductor, a resistor, a crystal oscillator, a duplexer, a filter, an amplifier, or the like. The mount component 102 is mounted on the mount surface 101b by being joined by soldering H. As shown in FIG. 2, the plurality of mount components 102 are mounted on the circuit substrate 101. It should be noted that the number or arrangement of mount components 102 is not particularly limited.

The sealing body 103 includes a sealing material, and covers the mount component 102 on the mount surface 101b. Examples of the sealing material include insulating resin such as epoxy resin to which silica or alumina is added.

The sealing body 103 has a main surface 103b being an upper surface in the Z-axis direction facing the mount surface 101b and an outer peripheral surface 103c including two planes facing the X-axis direction and two planes facing the Y-axis direction. On the sealing body 103, a trench 106 being a groove portion recessed from the main surface 103b to the mount surface 101b is formed.

The trench 106 is formed by removing the sealing body 103 in a concave shape from the main surface 103b. As shown in FIG. 2, the trench 106 is formed along the surface layer conductor 105. Moreover, as shown in FIG. 4, the trench 106 extends from the main surface 103b to the surface layer conductor 105. The trench 106 is disposed between the plurality of mount components 102 and separates the mount components 102.

As shown in FIGS. 2 and 5, both end portions of the trench 106 extend to the front of the outer peripheral surface 103c of the sealing body 103. Specifically, an end wall portion 103a being a part of the sealing body 103 remains between each end portion of the trench 106 and the outer peripheral surface 103c of the sealing body 103. Therefore, as shown in FIG. 2, the right and left portions of the sealing body 103 divided by the trench 106 are connected by two end wall portions 103a. The size of the end wall portion 103a in the X-axis direction may be within a range of 100 to 300 μm, for example.

The shield 104 includes a shield material being a conductive material, and functions as a shield against electromagnetic interference. The shield material may be conductive resin, e.g., epoxy resin including conductive particles such as Ag and Cu, or a metal film formed by plating on the sealing body 103, for example.

As shown in FIG. 4, the shield 104 has an external shield portion 104a and an internal shield portion 104b. The external shield portion 104a covers the main surface 103b and the outer peripheral surface 103c of the sealing body 103. The internal shield portion 104b is filled in the trench 106. As shown in FIG. 4, the internal shield portion 104b abuts the surface layer conductor 105.

The external shield portion 104a leads to the internal shield portion 104b, and is electrically connected to the surface layer conductor 105 via the internal shield portion 104b. As described above, the surface layer conductor 105 can be ground of the circuit module 100 and the shield 104 can have a ground potential.

The shield 104 has a function to block electromagnetic interference in the circuit module 100. Specifically, the external shield portion 104a blocks an electromagnetic wave from the outside of the circuit module 100 to the mount component 102 and an electromagnetic wave from the mount component 102 to the outside of the circuit module 100. Moreover, the internal shield portion 104b blocks an electromagnetic wave between the mount components 102.

As described above, in the circuit module 100, the material forming the sealing body 103 is different from the material forming the shield 104. Therefore, for example, the degree of expansion and contraction due to heat in the sealing body 103 is different from that in the shield 104. In such a case, stress for deforming the circuit module 100 to fill the gap between the expansion and contraction of the sealing body and those of the shield 104 is applied on the circuit module 100.

Here, a circuit module in which a trench penetrates to the outer peripheral surface of a sealing body unlike the circuit module 100 according to this embodiment is assumed. Specifically, the circuit module does not have the end wall portion 103a according to this embodiment and the sealing body is divided in half by the trench. It should be noted that another configuration of the circuit module is same as that of the circuit module 100 according to this embodiment.

When the above-mentioned stress is applied on the circuit module, warpage occurs in some cases. Since the sealing body is divided in half by the trench in the circuit module, stress concentrates on the vicinity of the trench, and warpage is likely to occur around the trench. Specifically, the circuit module is likely to have a convex-up shape or convex-down shape in the posture shown in FIG. 4.

Specifically, in the case where the shield expands more than the sealing body or the sealing body contracts more than the shield, the circuit module is likely to have a convex-up shape in the posture shown in FIG. 4. Moreover, in the case where the shield contracts more than the sealing body or the sealing body expands more than the shield, the circuit module is likely to have a convex-down shape in the posture shown in FIG. 4.

On the other hand, as shown in FIG. 2, in the circuit module 100 according to this embodiment, the sealing body 103 is not fully divided by the trench 106, and the end wall portion 103a maintains the unity of the sealing body 103. Therefore, even if the above-mentioned stress is applied on the circuit module 100, warpage is unlikely to occur around the trench because the sealing body 103 maintains the shape integrally.

Moreover, both end portions of the trench 106 in the plane parallel to the main surface 103b of the sealing body 103 may have an arbitrary shape. However, as shown in FIG. 2, the end portions favorably have a semicircular shape (circular arc). Specifically, the plane of the end wall portion 103a on the side of the trench 106 favorably has a semicircular shape. In this case, stress applied from the shield 104 to the end wall portion 103a due to the expansion or contraction of the shield 104 is likely to be dispersed by the semicircular plane of the end wall portion 103a. Therefore, the end wall portion 103a is unlikely to be deformed due to the stress applied from the shield 104 to the end wall portion 103a.

As described above, the circuit module 100 according to this embodiment is unlikely to be deformed by the configuration of the end wall portion 103a of the sealing body 103.

[Method of Manufacturing Circuit Module 100]

Figure 6:
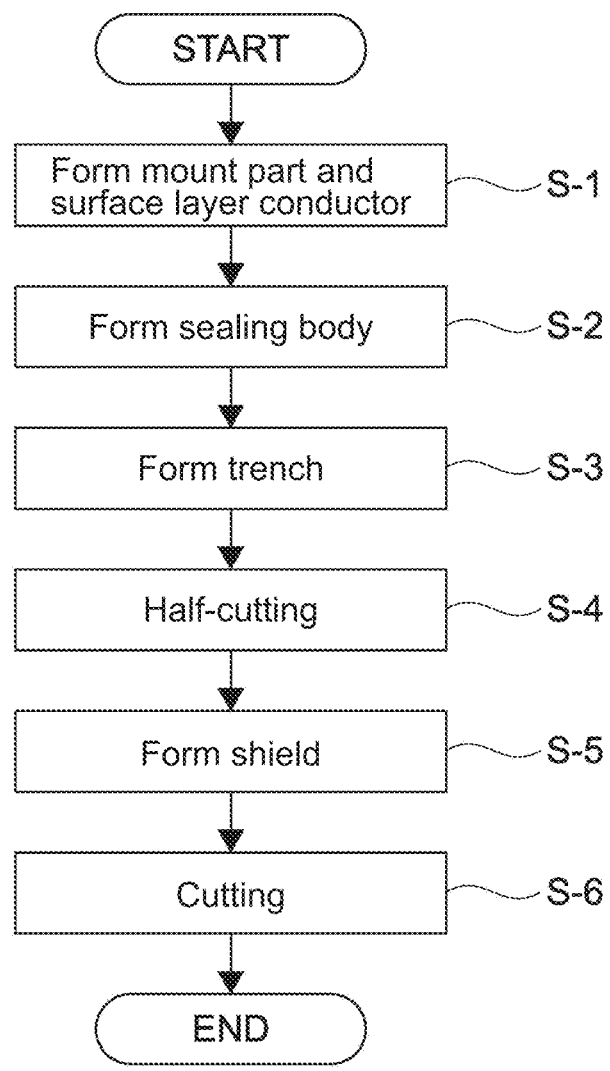
FIG. 6 is a flowchart showing a method of producing the circuit module.
Figure 8:
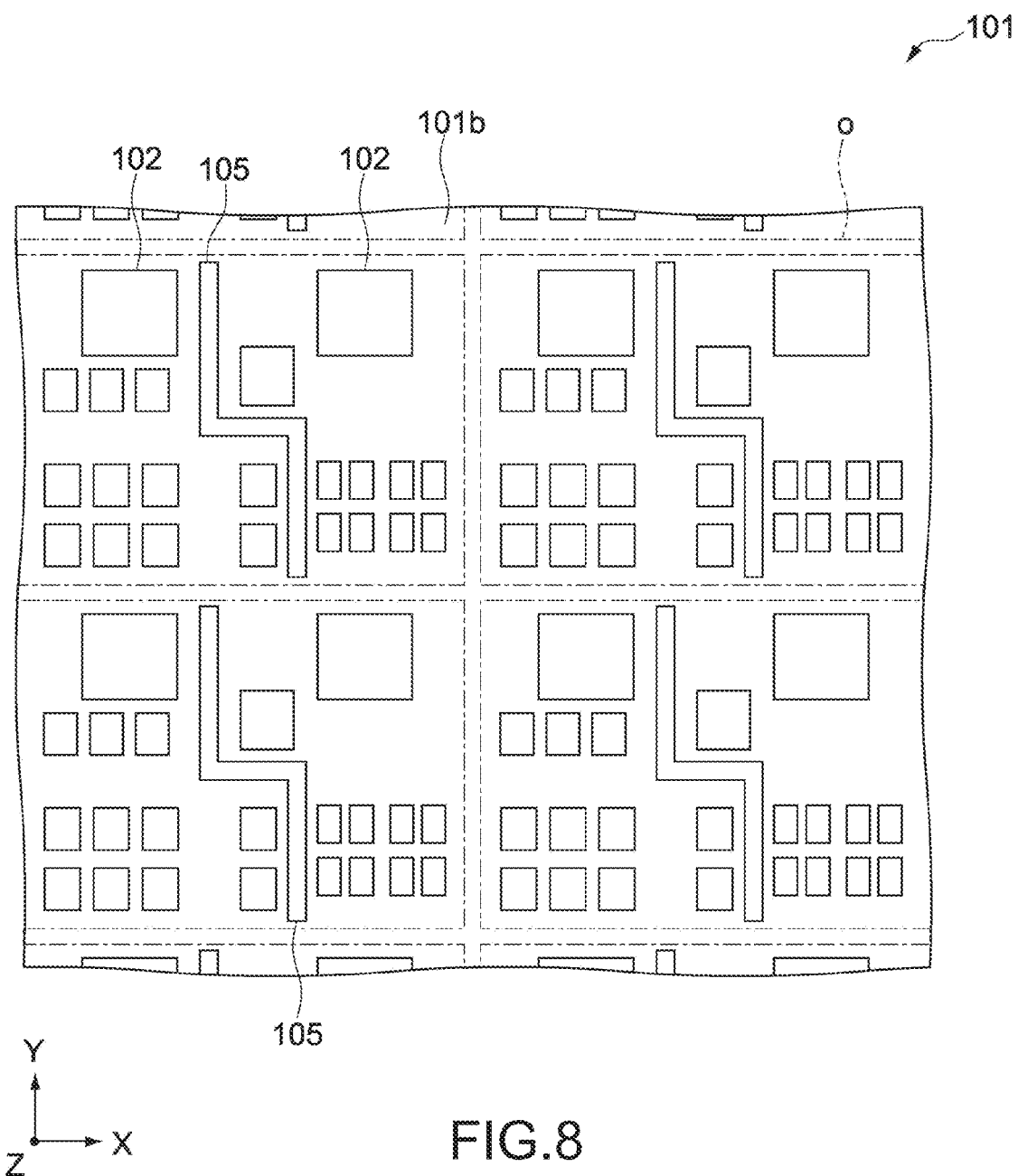
FIG. 8 is a plan view showing a process of producing the circuit module.
Figure 9:
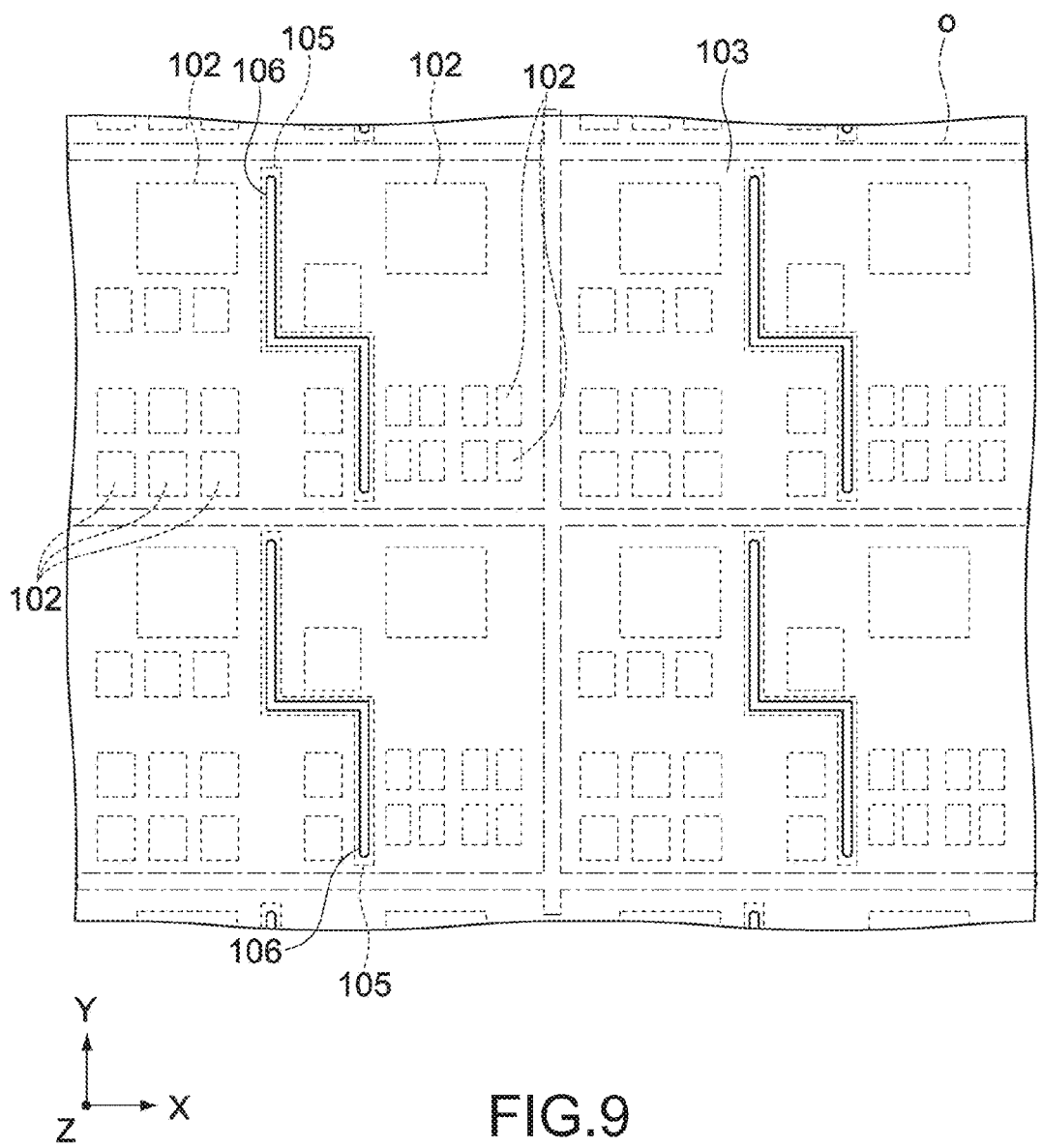
FIG. 9 is a plan view showing a process of producing the circuit module.
Figure 10:
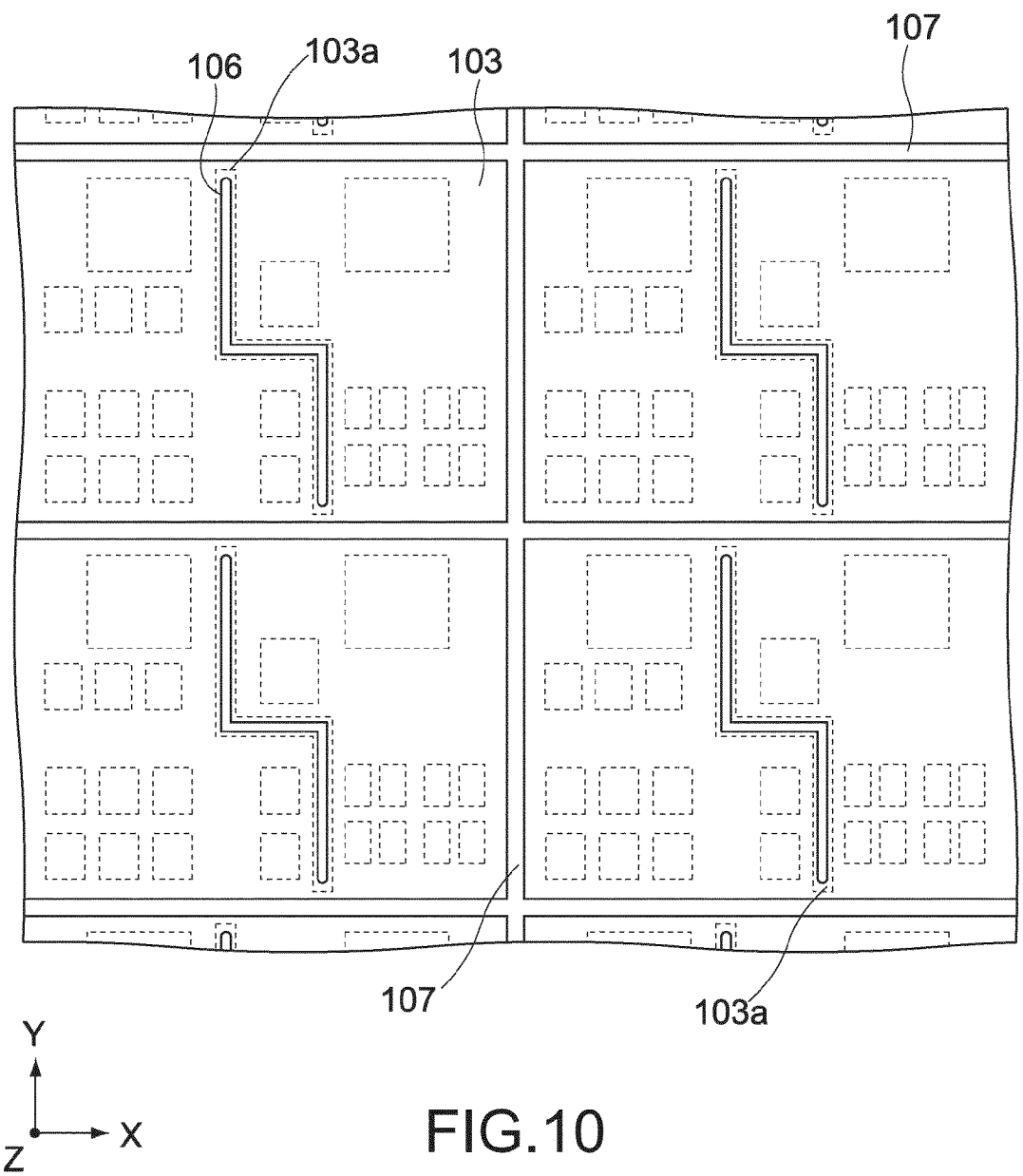
FIG. 10 is a plan view showing a process of producing the circuit module.

FIG. 6 is a flowchart showing a method of producing the circuit module 100 according to this embodiment. FIGS. 7 to 10 are diagrams showing a process of producing the circuit module 100. FIG. 7 are each a cross-sectional view, and FIGS. 8 to 10 are plan views. A method of producing the circuit module 100 will be described with reference to FIG. 6 and FIG. 7.

<Step S-1>

As shown in FIG. 7A, the mount components 102 are mounted on the mount surface 101b of the circuit substrate 101 to form the surface layer conductor 105. For mounting the mount components 102, various mounting methods such as soldering junction may be used. The surface layer conductor 105 may be formed by attaching a copper foil to the mount surface 101b or performing a plating process on the mount surface 101b, for example. Moreover, the surface layer conductor 105 may be formed also by applying liquid metal paste to the mount surface 101b and burning the applied metal paste to cure the metal paste, for example. Furthermore, the surface layer conductor 105 may be formed also by applying liquid conductive resin paste to the mount surface 101b and curing the applied conductive resin paste.

FIG. 8 is a plan view of the circuit substrate 101 in step S-1. In FIG. 8, an outline o of the sealing body 103 is represented by an alternate long and short dash line. Specifically, the outer peripheral surface 103c of the sealing body 103 is formed on the position of the alternate long and short dash line by half-cutting (S-4) to be described later. The interval between the alternate long and short dash line corresponds to the thickness of a blade used for the half-cutting (S-4). Both end portions of the surface layer conductor 105 do not reach the outline o of the sealing body 103. Specifically, a space is left between the surface layer conductor 105 and the outline o of the sealing body 103.

It should be noted that the surface layer conductor 105 may reach the outline o of the sealing body 103. In this case, the surface layer conductor 105 can be electrically connected to the shield 104 at the end portion of the surface layer conductor 105. However, as shown in FIG. 8, it is possible to prevent a burr of the surface layer conductor 105 from forming on the outer peripheral surface 103c of the sealing body 103 by leaving a space between the surface layer conductor 105 and the outline o of the sealing body 103.

In detail, although the surface layer conductor 105 is formed of a conductive material such as copper, a burr is likely to be formed by processing such as dicing if such a conductive material is used. However, as shown in FIG. 8, in the case where a space is left between the surface layer conductor 105 and the outline o of the sealing body 103, a burr of the surface layer conductor 105 is not formed on the outer peripheral surface 103c of the sealing body 103 because the surface layer conductor 105 does not exist in the processing area for the half-cutting (S-4).

<Step S-2>

As shown in FIG. 7B, the sealing body 103 is formed on the mount surface 101b of the circuit substrate 101. The sealing body 103 is formed by covering the mount component 102 with a fluid sealing material and curing the sealing material, for example. The main surface 103b of the sealing body 103 facing the mount surface 101b of the circuit substrate 101 (upper surface in Z-axis direction) only needs to be located at a position higher than each mount component 102.

<Step S-3>

As shown in FIG. 7(C), the trench 106 is formed in the sealing body 103. The trench 106 is formed by laser processing, i.e., applying a laser from the side of the main surface 103b of the sealing body 103. It should be noted that although a method other than the laser processing may be used as the method of forming the trench 106, the laser processing is favorably used from a viewpoint of high-precision processability or the like.

The medium used for the laser processing can be determined appropriately, and a solid laser or a gas laser can be used, for example. The strength of the laser during the laser processing can be determined appropriately as long as the laser penetrates the sealing body 103 and does not damage the surface layer conductor 105.

FIG. 9 is a plan view of the sealing body 103 in step S-3. In the laser processing, a laser is scanned from one end portion of the surface layer conductor 105 to the other end portion of the surface layer conductor 105. Accordingly, the trench 106 is formed along the surface layer conductor 105. Both end portions of the trench 106 do not reach the outline o of the sealing body 103 similarly as the surface layer conductor 105. Specifically, a space is left between the trench 106 and the outline o of the sealing body 103.

If the trench 106 reaches the outline o of the sealing body 103, the half-cutting (S-4) is performed across the trench 106. In this case, the angle portion of the trench 106 cracks in some cases. If the angle portion of the trench 106 cracks, the mount component 102 is not fully sealed by the sealing body 103 and the mount component 102 shorts out via the shield 104 (see FIGS. 3 to 5) in some cases.

In this embodiment, however, the trench 106 does not reach the outline o of the sealing body 103 and there is no need to perform processing across the trench. Therefore, there is no possibility of cracking of the angle portion of the trench 106. Accordingly, the reliability of sealing of the mount component 102 by the sealing body 103 is improved.

<Step S-4>

As shown in FIG. 7(D), a half-cut portion 107 is formed. The half-cut portion 107 is formed by dicing from a viewpoint of easy processability. It should be noted that a method other than dicing may be used as a method of forming the half-cut portion 107 and laser processing may be used, for example.

If the half-cut portion 107 is formed, the outer peripheral surface 103c of the sealing body 103 is formed. The half-cut portion 107 is formed by cutting out the sealing body 103 and the circuit substrate 101 to the depth of about one-third of the thickness of the circuit substrate 101 from the main surface 103b of the sealing body 103, for example. It should be noted that although the depth of the half-cut portion 107 in the Z-axis direction can be determined arbitrarily, the half-cut portion 107 favorably reaches the mount surface 101b of the circuit substrate 101 in order to exert the function of the shield 104 (see FIGS. 3 to 5) satisfactorily.

FIG. 10 is a plan view of the sealing body 103 in step S-4. As described above, because the surface layer conductor 105 is not exposed to the half-cut portion 107, a burr of the surface layer conductor 105 is not formed on the half-cut portion 107. Moreover, because the trench 106 does not intersect with the half-cut portion 107, the angle portion of the trench 106 does not crack.

<Step S-5>

As shown in FIG. 7(E), the shield 104 is formed. The shield 104 is formed by applying, from above the sealing body 103, liquid conductive resin to the trench 106 and the half-cut portion 107 to sufficiently fill in them and curing the applied conductive resin, for example.

<Step S-6>

As shown in FIG. 7(F), the product obtained through each step is cut into each circuit module 100. Specifically, the central part of the half-cut portion 107 is cut to leave the shield 104 on both sides thereof. The cutting method can be determined appropriately.

It should be noted that the order of step S-3 and step S-4 shown in FIG. 6 can be replaced with each other. In other words, the half-cut portion 107 shown in FIG. 7(D) may be formed before the trench 106 shown in FIG. 7(C) is formed.

In this case, if the trench 106 to be formed after the half-cut portion 107 is formed reaches the half-cut portion 107, a laser for forming the trench 106 enters the half-cut portion 107 and the depth of the half-cut portion 107 increases partially. In this embodiment, however, because the trench 106 does not reach the half-cut portion 107, it is possible to prevent the shape of the half-cut portion 107 from being damaged.

Modified Example

The process of forming the trench (step S-3) out of the producing processes shown in FIG. 6 in a circuit module according to a modified example of this embodiment is different from that in this embodiment. In the above-mentioned embodiment, a laser with constant output is applied when the trench 106 is formed. On the other hand, in this modified example, output of the laser is set to be lower at both end portions of the trench 106 shown in FIG. 9 (at a position adjacent to the end wall portion 103a) than at other portions of the trench 106 when the trench 106 is formed. Specifically, output of the laser is set to be low at the irradiation start position and irradiation stop position of the laser.

At the irradiation start position and irradiation stop position of the laser, energy of the laser is easy to be concentrated. Therefore, in the case where a laser with constant output is used, the interlayer wiring of the circuit substrate 101 is likely to be damaged by the laser at the irradiation start position and irradiation stop position of the laser. In this modified example, because output of the laser is set to be low at the irradiation start position and irradiation stop position of the laser, the interlayer wiring of the circuit substrate 101 is unlikely to be damaged.

In this modified example, because output of the laser is set to be low at the irradiation start position and irradiation stop position of the laser when the trench 106 is formed, the trench 106 does not penetrate to the surface layer conductor 105 at both end portions of the trench 106. Therefore, the size of the end wall portion of the sealing body 103 in the X-axis direction (scanning direction of laser) is large at the position adjacent to the surface layer conductor 105.

Specifically, with respect to the size of the end wall portion in the X-axis direction, the size the lower portion of the end wall portion in the Z-axis direction is larger than that of the upper portion of the end wall portion in the Z-axis direction by 100 to 200 µm. For example, in the case where the upper portion of the end wall portion in the Z-axis direction is 100 µm, the lower portion of the end wall portion in the Z-axis direction is 200 to 300 µm, and in the case where the upper portion of the end wall portion in the Z-axis direction is 300 µm, the lower portion of the end wall portion in the Z-axis direction is 400 to 500 µm.

FIG. 11 are each a cross-sectional view of the circuit module according to the modified example of this embodiment. In FIG. 11, the shape of the end wall portion of a circuit module produced by a method of producing a circuit module according to this modified example is exemplified. However, it goes without saying that the shape of the end wall portion of the circuit module can be variously changed depending on the output of the laser or the like.

Figure 11A:
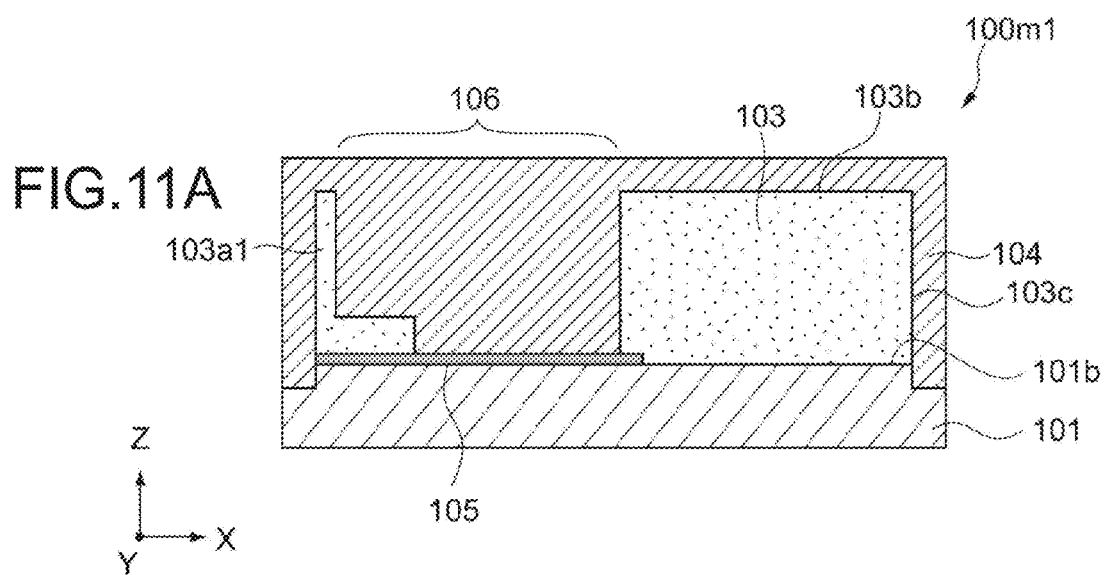
FIGS. 11A-11C are each a cross-sectional view of a circuit module according to a modified example of the present disclosure.

An end wall portion 103a1 of a circuit module 100m1 shown in FIG. 11A has a stair shape. Specifically, in the circuit module 100m1, the trench 106 is formed to have a predetermined depth of the sealing body 103 at the end portion of the trench 106, which leaves an end wall portion 103a1 having a predetermined height on the bottom surface of the trench 106. As a result, the end wall portion 103a1 is formed to have a stair shape by a portion in which the trench 106 is not formed and a portion in which the trench 106 is formed to have a predetermined depth.

Figure 11B:
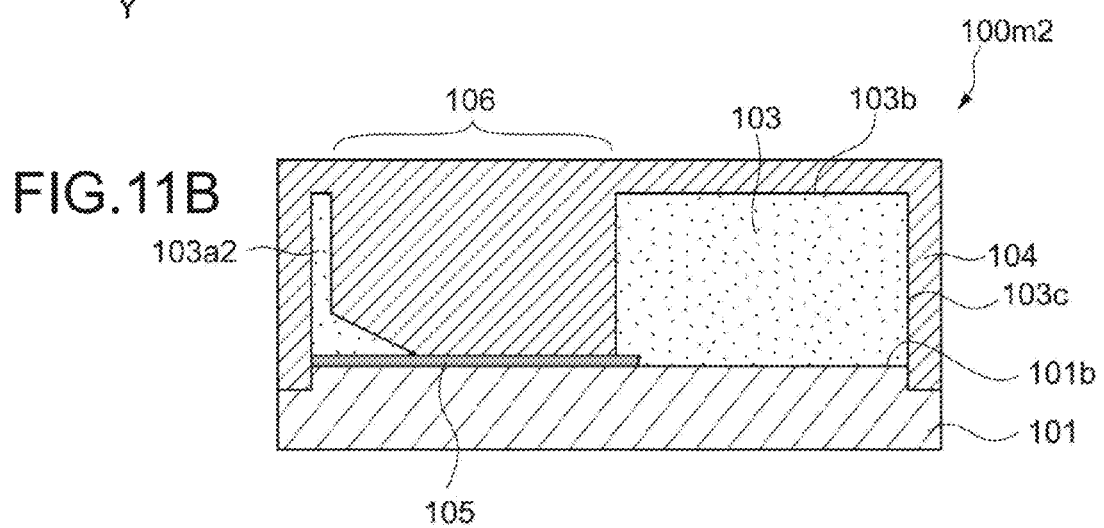

An end wall portion 103a2 of a circuit module 100m2 shown in FIG. 11B has a slope shape. Specifically, in the circuit module 100m2, the trench 106 is formed to have an increasing depth at a predetermined proportion at the end portion of the trench 106, which leaves the end wall portion 103a2 having a slope shape on the bottom surface of the trench 106.

Figure 11C:
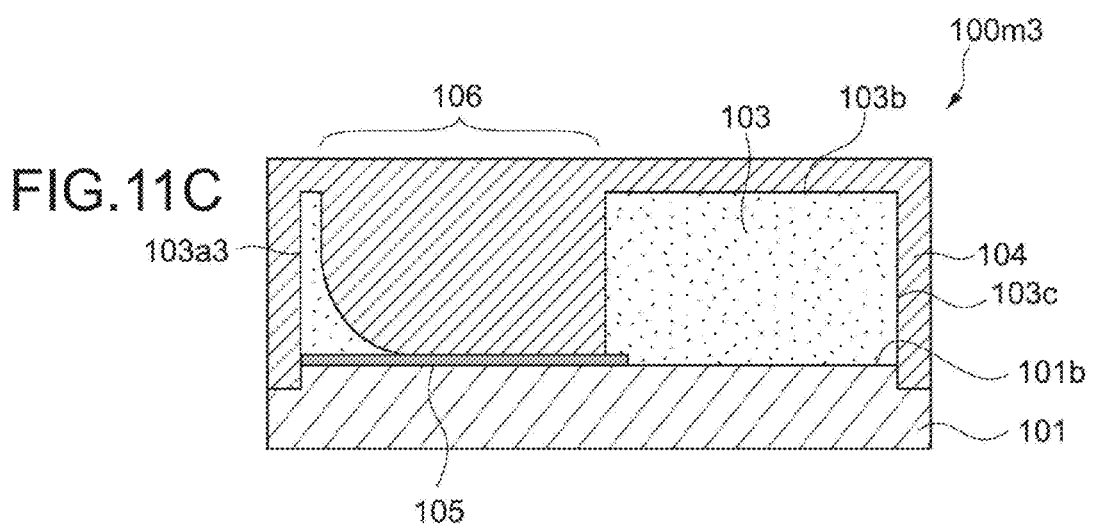

An end wall portion 103a3 of a circuit module 100m3 shown in FIG. 11(C) has a circular arc shape. Specifically, the circuit module 100m3 is formed so that the trench 106 gradually deepens at the end portion of the trench 106 and the end wall portion 103a3 has a circular arc shape. Accordingly, the stress applied on the end wall portion 103a3 due to the expansion or contraction of the shield 104 is easily dispersed by the plane of the end wall portion 103a3, which has a circular arc shape. Therefore, the end wall portion 103a3 is unlikely to be deformed due to the stress applied from the shield 104.

Although embodiments of the present disclosure have been described, the present disclosure is not limited to the above-mentioned embodiments and various modifications can be made without departing from the gist of the present disclosure.

For example, although one trench is provided in the circuit module according to this embodiment, a plurality of trenches may be provided in the circuit module. Moreover, although the trench is formed to have a linear shape in the circuit module according to this embodiment, the trench may be formed so as to be branched on the way.

What is claimed is:

1. A circuit module, comprising:
    a substrate having a mount surface;
    a mount component mounted on the mount surface;
    a sealing body having a main surface and an outer peripheral surface, the sealing body sealing the mount component, the main surface sandwiching the mount component between the main surface and the mount surface, the outer peripheral surface covering the mount component on the mount surface;
    a trench having a groove-like shape, the trench being recessed from the main surface of the sealing body to the mount surface, the trench having two end portions adjacent to and spaced apart from the outer peripheral surface, the trench having an intermediate portion extending continuously along the mount surface from one end portion to the other end portion with the end portions being spaced apart from one another in a direction parallel to the sealing body main surface, the two end portions each having either a stepped configuration or a lower portion thereof that extends up toward the sealing body main surface in an inclined or a curved manner and being formed to be shallower than the intermediate portion of the trench extending between the two end portions, the intermediate portion having a constant depth; and
    a shield having an external shield portion covering the main surface and the outer peripheral surface of the sealing body, and an internal shield portion being filled in the trench with the external shield portion along the outer peripheral surface being spaced from the internal shield portion in the two end portions of the trench.

2. The circuit module according to claim 1, wherein
    the mount component includes a plurality of mount components, and
    the trench separates the plurality of mount components from each other.

3. The circuit module according to claim 1, wherein
    the trench end portions are shaped like a circular arc on the main surface.

4. The circuit module according to claim 1, wherein the trench has opposite sides that extend between the trench end surfaces and up toward the sealing body main surface with the trench opposite sides being parallel to each other.

5. The circuit module according to claim 1, wherein both the external and internal shield portions are of the same conductive material and have substantially the same thickness thereof.

6. The circuit module according to claim 1, further comprising:
a surface layer conductor provided on the mount surface along the trench extending from the main surface to the surface layer conductor, the shield being connected to the surface layer conductor, and the surface layer conductor having two end portions adjacent to and spaced apart from the outer peripheral surface, the surface layer conductor extending continuously along the mount surface from one end portion to the other end portion.

7. A method of producing a circuit module, comprising:
mounting a mount component on a mount surface of a substrate;
providing a sealing body on the mount surface, the sealing body having a main surface, the sealing body sealing the mount component, the main surface sandwiching the mount component between the main surface and the mount surface;
forming an outer peripheral surface on the sealing body provided on the mount surface by cutting the sealing body along an outline of the sealing body, the outer peripheral surface covering the mount component on the mount surface;
forming a trench on the sealing body provided on the mount surface, the trench being recessed from the main surface of the sealing body to the mount surface, the trench having two end portions adjacent to and spaced apart from the outer peripheral surface, the trench having an intermediate portion extending continuously along the mount surface from one end portion to the other end portion with the end portions spaced apart from one another in a direction parallel to the sealing body main surface, the two end portions each having either a stepped configuration or a lower portion thereof that extends up toward the sealing body main surface in an inclined or a curved manner and being formed to be shallower than the intermediate portion of the trench extending between the two end portions, the intermediate portion having a constant depth;
filling an internal shield portion of a shield in the trench after the outer peripheral surface and the trench are formed on the sealing body, the shield having an external shield portion covering the main surface and the outer peripheral surface of the sealing body with the external shield portion along the outer peripheral surface being spaced from the internal shield portion in the two end portions of the trench.

8. The method of producing a circuit module according to claim 7 including forming a surface layer conductor on the mount surface along the trench, the trench extending from the main surface to the surface layer conductor, and the surface layer conductor having two end portions adjacent to and spaced apart from the outer peripheral surface, the surface layer conductor extending continuously along the mount surface from one end portion to the other end portion with the internal shield portion being connected to the surface layer conductor.

9. The method of producing a circuit module according to claim 7, wherein the trench is formed by laser processing.

10. The method of producing a circuit module according to claim 9, wherein
output of a laser when the trench is formed is set to be lower at the end portions of the trench than at other portions of the trench.

11. The method of producing a circuit module according to claim 8, wherein
the surface layer conductor is formed on the mount surface along the trench before the sealing body is provided on the mount surface.

\* \* \* \* \*